United States Patent
Kuusisto et al.

(10) Patent No.: US 10,457,154 B2
(45) Date of Patent: Oct. 29, 2019

(54) METHOD AND SYSTEM FOR DETERMINING A PARAMETER MAP FOR ESTIMATING AN OPERATION CONDITION OF AN ENERGY STORAGE DEVICE

(71) Applicant: VOLVO CAR CORPORATION, Gothenburg (SE)

(72) Inventors: Hannes Kuusisto, Gothenburg (SE); Bjorn Fridholm, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 184 days.

(21) Appl. No.: 14/859,734

(22) Filed: Sep. 21, 2015

(65) Prior Publication Data
US 2016/0096443 A1 Apr. 7, 2016

(30) Foreign Application Priority Data
Oct. 3, 2014 (EP) .................................... 14187621

(51) Int. Cl.
*B60L 11/18* (2006.01)
*G01R 31/36* (2019.01)
(Continued)

(52) U.S. Cl.
CPC .......... *B60L 11/1861* (2013.01); *G01R 31/36* (2013.01); *G01R 31/367* (2019.01); *G01R 31/3648* (2013.01); *G01R 31/374* (2019.01)

(58) Field of Classification Search
CPC ............ G01R 32/3651; G01R 31/3624; G01R 31/3648; G01R 31/3675; G01R 31/361;
(Continued)

(56) References Cited

U.S. PATENT DOCUMENTS 7,373,264 B2   5/2008   Verbrugge et al.
8,922,217 B2   12/2014  Mao et al.
(Continued)

FOREIGN PATENT DOCUMENTS

CN   102680795 A   9/2012
CN   103389468 A   11/2013
(Continued)

OTHER PUBLICATIONS

Extended European Search Report for European Application No. 14187621.9, Completed by the European Patent Office, dated Mar. 26, 2015, 5 Pages.
(Continued)

*Primary Examiner* — Gene N Auduong
(74) *Attorney, Agent, or Firm* — Brooks Kushman P.C.

(57) ABSTRACT

A method and a system are disclosed for determining a parameter map used for estimating an operation condition for an energy storage device which may be an energy storage device. The method includes updating the parameter map. When updating the parameter map, a correlation model is implemented taking into account aging behavior of the energy storage device. The model comprises correlation between different parts of the parameter map which enables updating the parameter map at parts which is presently not at a current operating point. Based on the parameter map, an operation condition of the energy storage device may be determined.

14 Claims, 4 Drawing Sheets

(51) Int. Cl.
*G01R 31/374* (2019.01)
*G01R 31/367* (2019.01)

(58) Field of Classification Search
CPC .............. G01R 31/3662; G01R 31/006; G01R 31/3679; G01R 31/3606; G01R 31/3658; G01R 31/362; G01R 31/3631; G01R 31/3634; G01R 31/3693
USPC ........................................ 702/63, 64; 324/46
See application file for complete search history.

(56) References Cited

U.S. PATENT DOCUMENTS

| | | | |
|---|---|---|---|
| 2006/0284600 A1 | 12/2006 | Verbrugge | |
| 2010/0153038 A1 | 6/2010 | Tomura et al. | |
| 2013/0300190 A1* | 11/2013 | Mao | ................... G01R 31/3624 307/9.1 |
| 2014/0032141 A1 | 1/2014 | Subbotin et al. | |
| 2014/0278169 A1 | 9/2014 | Kim | |
| 2015/0100260 A1* | 4/2015 | Joe | ..................... G01R 31/3606 702/63 |
| 2015/0251556 A1* | 9/2015 | Meyer | ................. B60L 11/1861 701/22 |

FOREIGN PATENT DOCUMENTS

| | | |
|---|---|---|
| CN | 103823187 A | 5/2014 |
| CN | 103941196 A | 7/2014 |

OTHER PUBLICATIONS

Chinese Patent Office, Office Action for corresponding Chinese Application No. 2015106215482, dated Feb. 27, 2019.
Chinese Patent Office, Search Report for corresponding Chinese Application No. 2015106215482, dated Feb. 18, 2019.

* cited by examiner

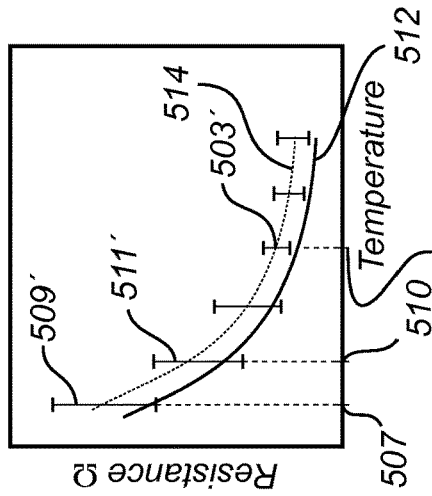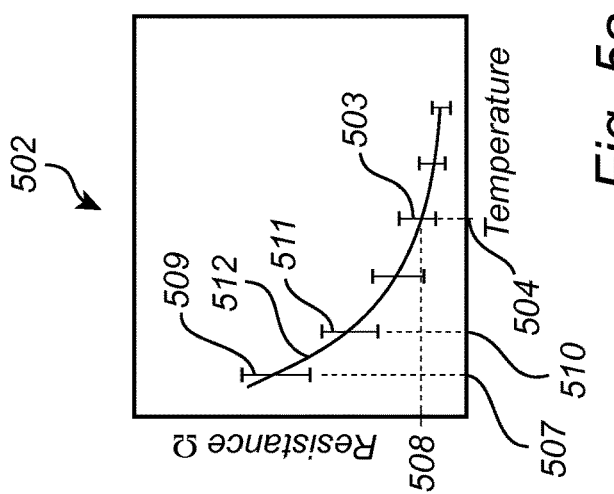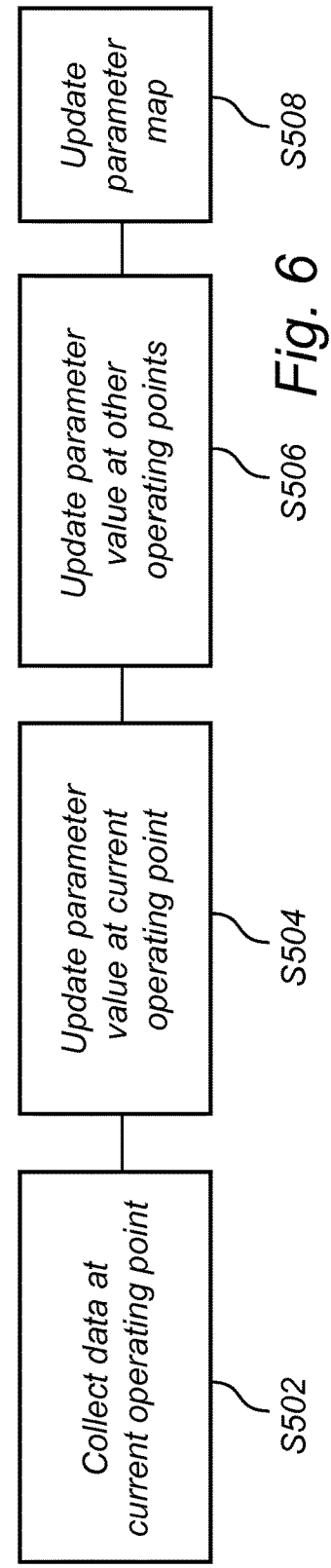

METHOD AND SYSTEM FOR DETERMINING A PARAMETER MAP FOR ESTIMATING AN OPERATION CONDITION OF AN ENERGY STORAGE DEVICE

CROSS-REFERENCE TO RELATED APPLICATIONS

This application claims foreign priority benefits under 35 U.S.C. § 119(a)-(d) to European patent application number EP 14187621.9, filed Oct. 3, 2014, which is incorporated by reference in its entirety.

TECHNICAL FIELD

The present disclosure relates to a method and to a system for determining a parameter map for estimating an operation condition for an energy storage device.

BACKGROUND

Electric and hybrid vehicles have recently become a more common sight on roads worldwide. They have one thing in common and that is they all require a large and powerful rechargeable energy storage, for example a rechargable battery. Such rechargable batteries have a limited runtime every time it is recharged and a user typically has a way of monitoring an estimated currently available power and energy of the battery.

The available power, or other operation conditions of the battery such as for example state of charge (SoC) is typically estimated using a model. The model may need inputs relating to the battery, for example capacity and resistance of the battery cells of the battery, or the temperature of the battery. A commonly type of model comprises an equivalent circuit model through which a current-voltage characteristics is obtained for the model battery.

One example of a method for estimating a state of health of a battery is disclosed by U.S. Pat. No. 7,373,264 in which an equivalent circuit model and a recursive formula is used. The parameters of the model are updated as one part of the model.

The complexity of estimating e.g. state of charge increases when taking into account both battery parameters and aging of the battery. It would be desirable to somehow in an efficient way include these in the model in order to increase the accuracy of the estimated e.g. state of charge.

SUMMARY

In view of the above, it is a general object of the present disclosure to provide a more accurate method and system for estimating an operation condition, e.g. state of charge, of an energy storage device.

According to a first embodiment it is therefore provided a method for determining a parameter map used for estimating an operation condition for an energy storage device, the method comprising the steps of:

determining a first parameter value related to the operation condition of the energy storage device and a variance of the first parameter value, the first parameter value being related to a current operating point of a parameter map comprising at least two operating points each having a related parameter value;

for the current operating point, estimating an updated parameter value and an updated variance of the first parameter value;

for at least a portion of operating points of the parameter map, estimating an updated parameter value and an updated variance of each of the parameter values using a correlation model including correlation between the parameter value at the current operating point and each of the parameter values at the operating points in the portion of operating points in the parameter map; and based on the updated parameter values and updated variances, updating the parameter map by replacing the parameter values with the updated parameter values and the variances with the updated variances at the respective operating point.

In accordance with the disclosure a parameter map comprises a relation between the parameter and the operating points. Thus, a relation may be in the form of parameter values versus operating points, which may for example be shown in a graphical plot. For example, the parameter map may be a parameter as a function of operating points. Naturally, a "parameter" has an associated "parameter value". Of course, a parameter may have several parameter values.

At a given current operating point, an updated parameter value is estimated. The estimation may be performed using a recursive process. Such recursive process may be a recursive least square process or a Kalman filter technique, both well known in the art. In addition, the variance of the parameter value at the current operating point may be estimated using the same recursive least square process.

In accordance with the disclosure, "a portion" of operating points should be interpreted as that not all of the parameter values having related operating points in the parameter map are updated, or at least they do not all have to be updated. For example, if the parameter map comprises N parameter values having corresponding operating points, only N–n (N>n) of the parameter values may be updated. The current operating point may be included in the portion of operating points. In this case, the correlation model may be used also for the current operating point.

The present disclosure is based on the realization that the parameters of a parameter map may be updated based on a correlation model with predetermined data for each operating point of at least a portion of operating points. The parameter map may describe the behavior or characteristics of the energy storage device over a range of operating points. With the present disclosure, parts of the parameter map which are difficult to reach in a real situation but that also affect an estimate of an operation condition may also be updated. Thus, the estimate of the operation condition may in this way be improved.

The method may further comprise estimating the operation condition based on the updated parameter map. An operation condition may for example be state of charge (SoC), the present capacity (Q), self-discharge, the present amount of energy available in the energy storage device until the energy storage device is discharged, the present amount of energy needed until the energy storage device is fully charged, the amount of power immediately available without breaching any battery/cell voltage/current limits, and/or the estimated power available for any charge/discharge power pulse of any given length.

The estimate of the operation condition may for example be based on an equivalent circuit model comprising an internal resistance and capacitance of the energy storage. Note that also additional stray resistance (or other resistances) or capacitances may be taken into account in such equivalent circuit model.

According to an embodiment of the disclosure, the correlation model may be determined from predetermined experimental data including a relation between parameter values of a parameter at two different operating points in the parameter map. The experimental data may be based on lab measurements, or statistical data acquired from energy storage devices used in real situations. For example, the correlation model may comprise a relation between a parameter θ at the operating point θ' and the same parameter θ at another operating point θ". Thus, using historical data from several e.g. more than 10, 100, or even more than 1000 energy storage devices, a correlation between the parameter θ at different operating points θ' and θ" may be obtained. The experimental data may in this way incorporate data from energy storage devices of e.g. different age or with other deviations from an "ideal" battery.

According to another embodiment of the disclosure, the correlation model may comprise a correlation between the parameter value at the current operating point and the parameters values of all operating points excluding the current operating point in the parameter map. In other words, the previously mentioned portion of operating points may comprise all the operating points. In this way the entire parameter map is updated contrary to only a portion of it. Thereby, an even more accurate estimation of an operation condition may be obtained.

According to an embodiment of the disclosure, the parameter map may be related to one parameter type related to one operating point type. In other words the parameter map comprises the relation between, one parameter type, for example internal resistance, and one operating point type such as temperature of the energy storage device. The parameters may for example be part of an equivalent circuit model of the energy storage.

Alternatively, the parameter map may comprise the relation between one parameter type (e.g. internal resistance) and more than one operating point type (e.g. temperature and available energy). In this way, a three-axis graphical plot (i.e. surface plot) representation of the parameter map may be obtained.

According to yet another embodiment of the disclosure, the method may comprise: if a variance of a parameter value at an operating point of the parameter map is below a threshold value, the parameter value and the variance at the operating point is not updated. Thus, there may be a condition for updating the parameter value. If the variance of the parameter value is small, there may not be a need for updating the respective parameter value. Thereby, the parameter values with high uncertainty (i.e. higher variance) are more often updated than parameter values with low uncertainty. For example, there may be less need to update a parameter value which was recently updated than a parameter value which was not recently updated. With such selective updating, the method may further be improved by updating uncertain parameter values.

Examples of a parameter value may be an electrical resistance value and the operating points may be temperature values.

According to yet another embodiment of the disclosure, the correlation between parameter values at different operating points may be based on a correlation between parameter values and variances at operating points with respect to time. Thus, updated parameter values over time may be incorporated in the correlation model.

Furthermore, a forgetting factor (λ) may be included in the step of updating the parameter value and the variance to provide a first weight to a parameter value at an operating point at a first time and a second weight to parameter value at an operating point at a second time different from the first time. A forgetting factor may for example comprise an exponential relation such that a parameter value becomes less important the more time has passed.

The correlation model may comprise the correlation between the parameter value at a first operating point and other parameter values at other operating points. Therefore, the correlation model may be stored in a matrix $\Sigma_{ij}$ of the form:

$$\sum\nolimits_{ij} = \begin{bmatrix} \sigma_1^2 & \rho_{12}\sigma_1\sigma_2 & \cdots & \rho_{1n}\sigma_1\sigma_n \\ \rho_{12}\sigma_1\sigma_n & \sigma_2^2 & \cdots & \rho_{1n}\sigma_2\sigma_n \\ \vdots & \vdots & \ddots & \vdots \\ \rho_{1n}\sigma_1\sigma_n & \rho_{2n}\sigma_2\sigma_n & \cdots & \sigma_n^2 \end{bmatrix}$$

where $\rho_{ij}$ is the correlation between the parameter values at operating points i and j, and $\sigma_i$ is the estimated variance of the parameter value at operating point i.

In one embodiment of the disclosure, the operating points and the portion of parameters values may be updated according to:

$$\breve{\theta}_i(t+1) = \breve{\theta}_i(t) + K_i(t)\Sigma_{iU}\varepsilon_U(t)$$

$$\sigma_i(t+1) = \sigma_i(t)/\lambda \text{ if } tr(\sigma(t)/\lambda(t)) \leq C$$

$$\sigma_i(t+1) = \sigma_i(t) \text{ otherwise,}$$

where $\breve{\theta}_i$ is a parameter value, U denotes the current operating point, $K_i(t)$ is an estimator gain from the recursive process, and $\varepsilon_U$ is a residual at the current operating point U between an observed (measured) parameter value and the estimated parameter value, and C is a trimparameter and is a positive number.

Alternatively, updating the parameter values of the parameter map may comprises using a Kalman filter which is in it self also a recursive process. For example, the Kalman filter algorithm may take the form:

$$P_{k|k-1} = P_{k-1|k-1} + \Sigma$$

$$K_k = P_{k|k-1}H_k^T(H_k P_{k|k-1} H_k^T + R_k)^{-1}$$

$$\hat{\theta}_k = \hat{\theta}_{k-1} + K_k(y_k - H_k^T \hat{\theta}_{k-1})$$

$$P_{k|k} = P_{k|k-1} - K_k H_k P_{k|k-1}$$

Where P is a matrix comprising the covariances between different parameter values and the variances of the estimated parameter value in the present operating point, K is a Kalman gain (similar to the above estimator gain), H is a vector that depends on the current operating point, $R_k$ is a matrix comprising trimparameters of the Kalman filter, and $y_k$ is the present estimate of the parameter value. Generally, a Kalman filter is well known The vector H is determined based on a linear interpolation between predetermined operating points. Generally, $$n = \frac{X(k) - x_{i(k)}}{x_{i(k)+1} - x_{i(k)}} \text{ and}$$

$$H_j(k) = \begin{cases} 1 - n(k), & j = i(k) \\ n(k), & j = 1(k) + 1 \\ 0, & \text{otherwise} \end{cases}$$

As an example, consider X to be the current operating point, and [x1, x2, x3, x4] as predetermined operating points, then a number n is determined based on n=(x−x3)/(x4−x3) and H is then H=[0, 0, 1−n, n]. Moreover, the output estimate $y_k$ may be expressed as $y(k)=H_k\theta$.

According to a second embodiment of the present disclosure there is provided a system for estimating an operation condition for an energy storage device, the system comprising:

a sensor for measuring a parameter value related to an operation condition of the energy storage device; and a control unit electrically connected to the sensor configured to receive the parameter value from the sensor, wherein the control unit is further configured to:

determine a first parameter value related to the operation condition of the energy storage device and a variance of the first parameter value, the first parameter value being related to a current operating point of a parameter map comprising at least two operating points each having a related parameter value;

for the current operating point, estimate an updated parameter value and an updated variance of the first parameter value using a recursive process;

for a portion of operating points of the parameter map excluding the current operating point, estimate an updated parameter value and an updated variance of each of the parameter values using a correlation model including correlation between the parameter value at the current operating point and each of the parameter values at the operating points in the portion of operating points in the parameter map; and based on the updated parameter values and updated variances, update the parameter map by replacing the parameter values with the updated parameter values and the variances with the updated variances at the respective operating point.

The control unit is preferably a microprocessor or any other type of computing device. The control unit may comprise one or more microprocessors, microcontrollers, programmable digital signal processors (DSP) or other programmable devices, as well as an associated memory or memory unit. The control unit may also, or instead, include one or more application specific integrated circuits (ASIC), programmable gate arrays or programmable array logic, programmable logic devices, or digital signal processors. Where the control unit includes a programmable device such as a microprocessor, microcontroller or programmable digital signal processor, the associated memory or memory unit may store computer executable instructions that control operation of the programmable device and/or for performing the various operations and/or functions described herein. The control unit may also or alternatively comprise a computer readable medium which may be any type of memory device, including one of a removable nonvolatile/volatile random access memory, a hard disk drive, a floppy disk, a CD-ROM, a DVD-ROM, a USB memory, an SD memory card, or a similar computer readable medium known in the art.

The sensor may be configured to measure e.g. a voltage or current from the energy storage device, a voltage or current from individual energy storage cells of the energy storage device, a temperature of the energy storage device, a temperature of individual energy storage cells, the temperature of a coolant (e.g. a liquid coolant) used for cooling the energy storage device (or cells), cell balancing current (a current used for balancing the state of charge of different cells of the energy storage device), or whether contactors are closed such that the power may be drawn from the energy storage device, etc.

The system may advantageously comprise the energy storage device.

Furthermore, the system may advantageously be used for monitoring an energy storage device, such as a rechargeable battery, of an electric or hybrid vehicle. The system may thus advantageously be arranged in the vehicle. However, the control unit of the system may be arranged elsewhere, outside the vehicle.

Further effects and features of this second embodiment of the present disclosure are largely analogous to those described above in connection with the first embodiment of the disclosure.

Further features of, and advantages with, the present disclosure will become apparent when studying the appended claims and the following description. The skilled person realizes that different features of the present disclosure may be combined to create embodiments other than those described in the following, without departing from the scope of the present disclosure.

BRIEF DESCRIPTION OF THE DRAWINGS

These and other features of the present disclosure will now be described in more detail, with reference to the appended drawings showing a currently preferred embodiment of the disclosure, wherein:

FIGS. 5a-b show an exemplary implementation of an embodiment of the disclosure; and FIG. 6 is a flow-chart showing the steps described in FIG. 5.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In the following description, the present disclosure is mainly described with reference to an energy storage device. It should, however, be noted that this by no means limits the scope of the disclosure, which is equally applicable to other types of devices utilizing parameter maps for estimating a condition. For example, the disclosure may be used in the context of the state of health of an engine of the vehicle, apart from the state of health of a battery.

Figure 1:
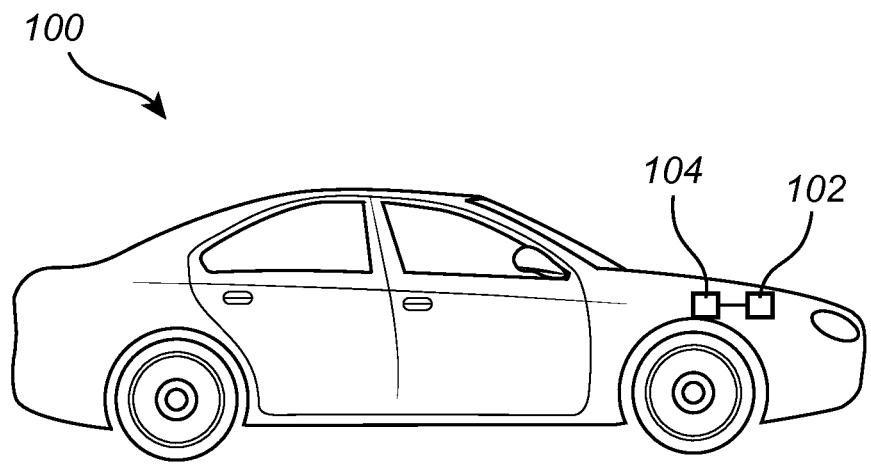
FIG. 1 illustrates an exemplary application for an embodiment of the disclosure.

FIG. 1 illustrates an exemplary application for a system according to an embodiment of the disclosure. In FIG. 1 there is shown a vehicle 100 in the form of e.g. a hybrid or electric car 100 comprising a rechargable battery 102. In the vehicle 100 there is further a charging system 104 for the rechargable battery controlling the battery and monitoring the operation and status of the battery. Note that the disclosure is equally applicable to a fuel cell based vehicle.

Figure 2:
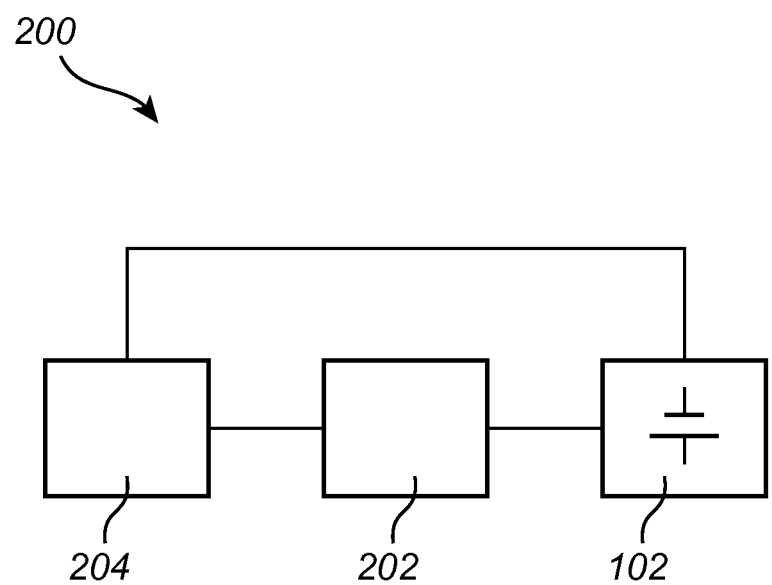
FIG. 2 schematically shows a system according to an exemplary embodiment of the disclosure.

FIG. 2 illustrates an exemplary system according to an embodiment of the disclosure. In FIG. 2, the system 200 comprises at least one sensor 202 and a control unit 204 the form of a microprocessor 204 connected to the sensor 202. The sensor may for example be a temperature sensor detecting the temperature of the battery 102 or a sensor to measure the internal resistance of the battery 102. Furthermore, the control unit 204 may also be directly connected to the battery 102 for controlling e.g. the outgoing supply of current of a charging current of the battery 102, or the control unit 204 may receive information regarding the state of the battery 102 directly from the battery. Thus, the control unit 204 is configured to monitor the state of the battery 102. In particular, the control unit 204 is configured to estimate an operation condition of the battery 102. The steps for estimating an operation condition will be described with reference to proceeding drawings of the application. The system may further comprise the necessary electrical components for monitoring the current power level, (i.e. the capacity Q) of the battery 102.

Figure 3:
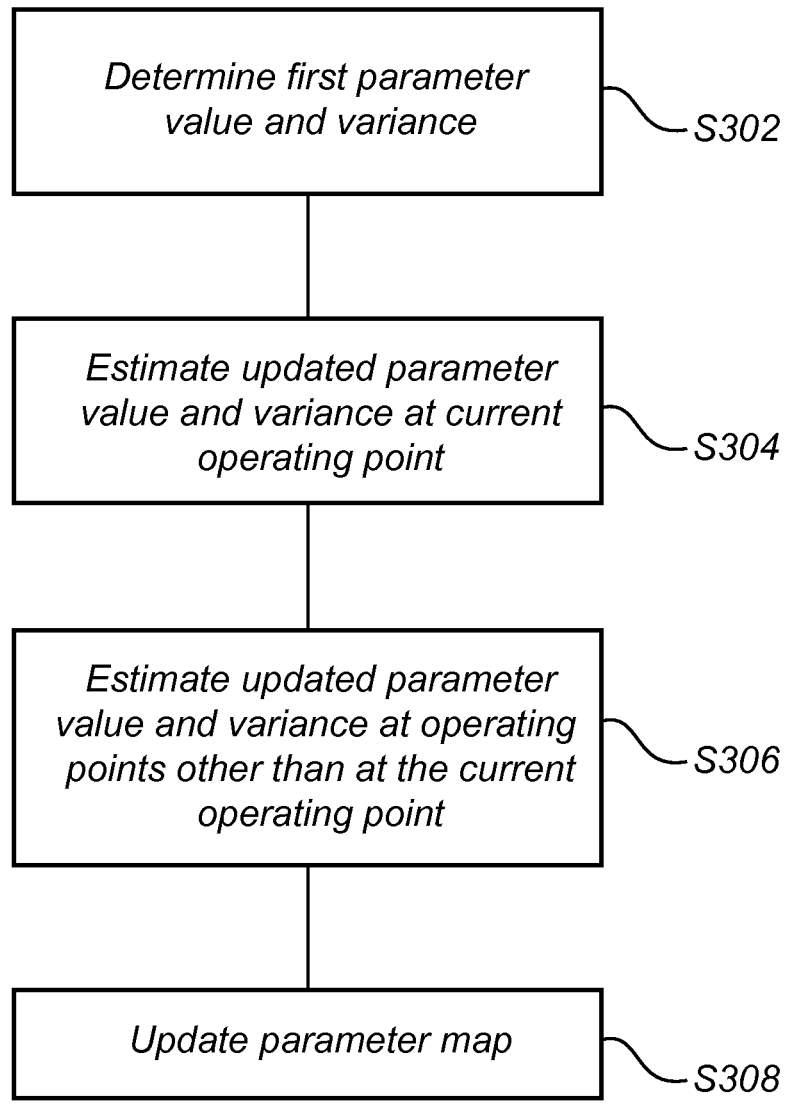
FIG. 3 is a flow-chart showing the steps according to an exemplary embodiment of the disclosure.

FIG. 3 is a flow-chart of the steps of an exemplary method according to an embodiment of the disclosure. In order to estimate an operation condition for an energy storage device, for example the battery 102, a parameter map is used. The parameter map however, needs to be updated over time due to e.g. system parameters change over time. In a first step S302 a first parameter value of the parameter map is determined at an operating point. The first parameter value is related to a parameter related to the operation condition of the energy storage device. Furthermore, in step S302 a variance of the first parameter value is determined. In order to update the parameter map, the following steps are used. In step S304, an updated parameter value and an updated variance at the current operating point are estimated. The estimation may be performed using a recursive least square process or a Kalman filter technique, and moreover, it may use the first parameter value and variance as an input. In a subsequent step S306, the method moves to other operating points of the parameter map, the operating points being different from the current operating point. In this step S306, an updated parameter value and updated variance at a portion of operating points of the parameter map are estimated. This estimation in step S306 is done by using a correlation model comprising the correlation between the parameter value at the current operating point and each of the parameter values at the operating points in the portion of operating points in the parameter map. In subsequent step S308, the parameter map is updated by replacing the previous parameter values and variances with the updated parameter values and variances. The updated parameter map may then subsequently be used for estimating e.g. the state of charge of a rechargeable battery. Other operation conditions are e.g. state of charge (SoC), the present capacity (Q), self-discharge, the present amount of energy available in the battery until the battery is discharged, the present amount of energy needed until the battery is fully charged, the amount of power immediately available without breaching any battery/cell voltage/current limits, and/or the estimated power available for any charge/discharge power pulse of any given length.

Note that the first parameter value and the respective variance may be values determined from a previous update of parameter values, or the first parameter value may be a first measurement to obtain the initial parameter value if there is no previous parameter value.

Figure 4:
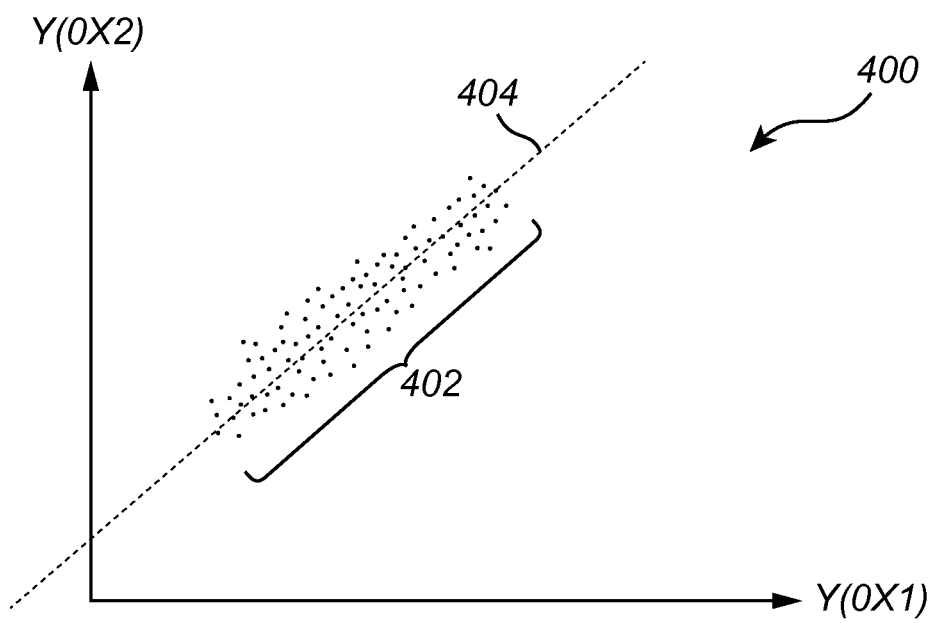
FIG. 4 shows an exemplary correlation model relation.

The correlation model is based on a relation between a first parameter value at a first operating point and a second parameter value at a second operating point. In this example, the first operating point may be denoted the current operating point. The relation, being at least part of the correlation model, is based on experimental data, and also on other historical data regarding the state of the battery. As an example, a graphical plot 400 showing a plurality of parameter values 402 of a parameter (Y) at operating point OX1 plotted versus the same parameter Y, but at operating point OX2 is shown in FIG. 4. The data points 402 are collected for batteries having different inherent characteristics (e.g. internal resistance, capacitance, capacity, aging, etc) but of course of the same type (e.g. "model"). This way, a relation 404, in this case a linear relation 404 between the parameter values at the two different operating points is obtained. Note that the relation may also be non-linear. In that case, the relation may for example be divided into sub-portions which are linear. Thus, the disclosure is still applicable even if the relation is non-linear, for example, due to that a long term correlation is preferable where the relations tend to at least be close to linear. Moreover, if a correlation between the parameters values at operating points OX1 and OX2 does not exist, the method still works since the method simply does not update the uncorrelated parameter value.

For the correlation model, one may assume that the parameter values Y(OX1) and Y(OX2) are normal distributed with corresponding mean values $\mu_{Y(OX1)}$ and $\mu_{Y(OX2)}$ and variances $\sigma^2_{Y(OX1)}$ and $\sigma^2_{Y(OX2)}$. In this case, we find the correlation between the parameters to be:

$$\rho_{12} = \frac{\text{cov}\{Y(OX1), Y(OX2)\}}{\sigma^2_{Y(OX1)}\sigma^2_{Y(OX2)}}. \tag{1}$$

The model used for the correlation between operating points may be given by a matrix $\Sigma$ given by:

$$\sum_{ij} = \begin{bmatrix} \sigma_1^2 & \rho_{12}\sigma_1\sigma_2 & \cdots & \rho_{1n}\sigma_1\sigma_n \\ \rho_{12}\sigma_1\sigma_n & \sigma_2^2 & \cdots & \rho_{1n}\sigma_2\sigma_n \\ \vdots & \vdots & \ddots & \vdots \\ \rho_{1n}\sigma_1\sigma_n & \rho_{2n}\sigma_2\sigma_n & \cdots & \sigma_n^2 \end{bmatrix},$$

where $\rho_{ij}$ is the correlation between the parameter values at operating points i and j, and $\sigma_i$ is the estimated variance of the parameter value at operating point i. The correlation $\rho_{ij}$ may be obtained from what was described with reference to FIG. 4 and equation (1).

Updating of a parameter may now be performed using the following procedure. In a first step, the residual $\varepsilon_U(t)$ at a current operating point U is calculated using the formula:

$$\varepsilon_T(t) = y(t) - \varphi(t)\hat{\theta}_U(t-1)$$

where y(t) and φ(t) are the observed (measured) parameter value and operating point respectively and $\hat{\theta}$ is the estimated parameter value (being part of a parameter map). In the next step, the parameter $\hat{\theta}_U$ and variance $P_U$ at the current operating point U is updated using the recursive least square algorithm, which may be given by the following algorithm:

$$\hat{\theta}_U(t) = \hat{\theta}_U(t-1) + K(t)\varepsilon(t)$$

$$K(t) = P_U(t-1)\varphi(t)(\lambda + \varphi^T(t)P_U(t-1)\varphi(t))^{-1}$$

$$P_U(t) = (I - K(t)\varphi^T(t))P_U(t-1)/\lambda$$

where I is the unity matrix. Alternatively, a Kalman filter technique may be used instead of the above recursive algorithm. Kalman filters are well known in the art. In a subsequent step, updating of the parameter map for operating points other than the current operating point is performed. This updating step may be based on the correlation model and may be performed according to the algorithm given by:

$$\breve{\theta}_i(t+1) = \breve{\theta}_i(t) + K_i(t)\Sigma_{iU}\varepsilon_U(t)$$

$$P_i(t+1) = P_i(t)/\lambda \text{ if } tr(P(t)/\lambda(t)) \leq C$$

$$P_i(t+1) = P_i(t) \text{ otherwise,}$$

where $\breve{\theta}_i$ is a parameter value, U denotes the current operating point, $K_i(t)$ is an estimator gain from the recursive process, and $\varepsilon_U$ is the residual at the current operating point U. The condition of the trace of the covariance is added in order to avoid "covariance wind-up". The parameter $\lambda$ is a forgetting factor. The forgetting factor may be in the form of a trimparameter and has a value in the range of 0 to 1, preferably close to 1 (e.g. 0.90-0.99).

FIG. 5a-b demonstrates an exemplary implementation of a method according to an embodiment of the disclosure, and FIG. 6 is a flow-chart of the corresponding method steps. In FIG. 5a there is shown a graph 502 of a parameter map having operating points in the form of temperature values and associated parameter values in the form of electrical resistance values. Each operating point and associated parameter value has a variance indicated by the error bars 503, 509, 511 (only three are numbered in order to avoid cluttering in the drawing). In this example, data is collected at the current operating point 504 which is +20° C. (step S502), thus the parameter value 508 is collected at the current operating point 504. Using the recursive process, RLS (or a Kalman filter), a parameter value, in other words a resistance value at the current operating point 504 +20° C. is updated (S504) using the collected parameter value 508. Similarly, the variance of the parameter value at the operating point 504 is also updated. Furthermore, as previously described, parameter values at operating points other than the current operating point 504 are updated according to a predetermined model (as described with reference to FIG. 4). As is shown in FIG. 5b, the parameter map has been updated (the dashed line 514 indicates the updated parameter map), in this example the entire parameter map 502 has been updated but this is not a requirement. In other examples only parts of the parameter map 502 may be updated. As can be seen in FIG. 5b, the variance indicated by error bars 509' and 511' of parameter values at operating points 507 and 510 have increased compared to variances indicated by error bars 509 and 511 in FIG. 5a. The solid line 512 indicates the previous parameter map shown in FIG. 5a. Thus the new parameter map indicated by line 514 has been updated in step S508 with respect to the previous parameter map indicated by the solid line 512. In the shown example in FIG. 5a-b, the parameter values in the form of electrical resistance values have increased, i.e. the line 514 lies above the line 512. It may also occur that the resistance values (or whichever parameter type is used) decreases, thus in that case the line 514 would lie below the line 512.

Additionally, variations to the disclosed embodiments can be understood and effected by the skilled person in practicing the disclosure, from a study of the drawings, the disclosure, and the appended claims. For example, other recursive methods may be used then the exemplary algorithms show herein. Furthermore, the method according to embodiments of the disclosure are still applicable even with an algorithm not being recursive.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method for determining a parameter map using a processor and associated memory, the parameter map used for estimating an operation condition for an energy storage device comprising a battery for an electric vehicle or a hybrid electric vehicle, the method comprising:
    receiving from a sensor a parameter value related to an operation condition of the energy storage device;
    determining a first parameter value of a parameter related to the operation condition of the energy storage device and a variance of the first parameter value, the first parameter value being related to a current operating point of a parameter map comprising at least two operating points each having a related parameter value of the parameter;
    for the current operating point, estimating an updated parameter value and an updated variance of the first parameter value, the update being an update over time;
    for at least a portion of operating points of the parameter map, estimating an updated parameter value and an updated variance of each of the parameter values using a correlation model including correlation between the parameter value at the current operating point and each of the parameter values at the operating points in the portion of operating points in the parameter map;
    based on the updated parameter values and updated variances, updating the parameter map by replacing the parameter values with the updated parameter values and the variances with the updated variances at the respective operating point;
    estimating the operation condition of the energy storage device based on the updated parameter map; and
    controlling an energy storage device current based on the estimated operation condition.

2. The method according to claim 1 wherein the correlation model is determined from predetermined experimental data including a relation between parameter values of a parameter at two different operating points in the parameter map.

3. The method according to claim 1 wherein the correlation model comprises a correlation between the parameter value at the current operating point and the parameters values of all operating points excluding the current operating point in the parameter map.

4. The method according to claim 1 wherein the parameter map is related to one parameter type related to one operating point type.

5. The method according to claim 1 wherein, if a variance of a parameter value at an operating point of the parameter map is below a threshold value, the parameter value and the variance at the operating point is not updated.

6. The method according to claim 1 wherein the parameter values are electrical resistance values or capacitance values and the operating points are temperature values.

7. The method according to claim 1 wherein the energy storage device is a rechargeable battery and the operation condition is state of charge.

8. The method according to claim 1 wherein the correlation between parameter values at respective operating points is based on a correlation between parameter values and variances at operating points with respect to time.

9. The method according to claim 1 wherein a forgetting factor ($\lambda$) is included in the step of updating the parameter value and the variance to provide a first weight to a parameter value at an operating point at a first time and a second weight to parameter value at an operating point at a second time different from the first time.

10. The method according to claim 1 wherein the correlation model is stored in a matrix $\Sigma_{ij}$ of the form:

$$\sum_{ij} = \begin{bmatrix} \sigma_1^2 & \rho_{12}\sigma_1\sigma_2 & K & \rho_{1n}\sigma_1\sigma_n \\ \rho_{12}\sigma_1\sigma_n & \sigma_2^2 & K & \rho_{1n}\sigma_2\sigma_n \\ M & M & O & M \\ \rho_{1n}\sigma_1\sigma_n & \rho_{2n}\sigma_2\sigma_n & K & \sigma_n^2 \end{bmatrix}$$

where $\rho_{ij}$ is the correlation between the parameter values at operating points i and j, and $\sigma_i$ is the estimated variance of the parameter value at operating point i.

11. The method according to claim 10 wherein the operating points and the portion of parameters values are updated according to:

$$\theta_{i,j}(t+1) = \theta_{i,j}(t) + K_i(t)\Sigma_{iU}\varepsilon_U(t)$$

$$P_i(t+1) = P_i(t)/\lambda$$

if tr(P(t)/$\lambda$(t))$\leq$C $P_i(t+1) = P_i(t)$ otherwise, where $\theta_{i,j}$ is a parameter value, U denotes the current operating point, $K_i(t)$ is an estimator gain, $\varepsilon_U$ is a residual at the current operating point U between an observed parameter value and the estimated parameter value, and C is a numerical parameter.

12. A system for estimating an operation condition for an energy storage device comprising a battery for an electric vehicle or a hybrid electric vehicle, the system comprising:

a sensor for measuring a parameter value related to an operation condition of the energy storage device; and a control unit electrically connected to the sensor and configured to receive the parameter value from the sensor, the control unit further configured to determine a first parameter value of a parameter related to the operation condition of the energy storage device and a variance of the first parameter value, the first parameter value being related to a current operating point of a parameter map comprising at least two operating points each having a related parameter value of the parameter, for the current operating point, estimate an updated parameter value and an updated variance of the first parameter value, the update being an update over time, for a portion of operating points of the parameter map excluding the current operating point, estimate an updated parameter value and an updated variance of each of the parameter values using a correlation model including correlation between the parameter value at the current operating point and each of the parameter values at the operating points in the portion of operating points in the parameter map, based on the updated parameter values and updated variances, update the parameter map by replacing the parameter values with the updated parameter values and the variances with the updated variances at the respective operating point, estimate the operation condition of the energy storage device based on the updated parameter map, and control an energy storage device current based on the estimated operation condition.

13. The system according to claim 12 further comprising the energy storage device.

14. A vehicle comprising a system according to claim 12.

* * * * *

UNITED STATES PATENT AND TRADEMARK OFFICE
CERTIFICATE OF CORRECTION

PATENT NO. : 10,457,154 B2  
APPLICATION NO. : 14/859734  
DATED : October 29, 2019  
INVENTOR(S) : Hannes Kuusisto et al.

Page 1 of 1

It is certified that error appears in the above-identified patent and that said Letters Patent is hereby corrected as shown below:

In the Claims

Column 11, Line 34, Claim 11:

Delete: "$\hat{\theta}_i(t+1) = \hat{\theta}_i(t) + K_i(t)\Sigma_{iU}\varepsilon_U(t)$," and Insert: --$\hat{\theta}_i(t+1) = \hat{\theta}_i(t) + K_i(t)\Sigma_{iU}\varepsilon_U(t)$--.

And

Column 11, Line 39, Claim 11:

Delete: "$\theta_i i$" and

Insert: --$\hat{\theta}_i$--.

Signed and Sealed this  
Seventh Day of April, 2020

Andrei Iancu  
*Director of the United States Patent and Trademark Office*